United States Patent [15] 3,651,422

Underhill [45] Mar. 21, 1972

[54] FREQUENCY SYNTHESISER

[72] Inventor: Michael James Underhill, Ifield, Crawley, England

[73] Assignee: U.S. Philips Corporation

[22] Filed: July 29, 1970

[21] Appl. No.: 59,066

[30] Foreign Application Priority Data

July 31, 1969 Great Britain ....................38,503/69

[52] U.S. Cl. ....................331/1 A, 331/14, 331/18

[51] Int. Cl. ....................H03b 3/04

[58] Field of Search ....................331/1, 14, 18

[56] References Cited

UNITED STATES PATENTS

| | | | |
|---|---|---|---|
| 3,271,688 | 9/1966 | Gschwind et al. | 331/1 |
| 3,185,938 | 5/1965 | Pelosi | 331/14 |
| 3,514,713 | 5/1970 | Leyde | 331/14 |
| 3,287,655 | 11/1966 | Venn et al. | 331/14 |
| 3,364,439 | 1/1968 | Cohen et al. | 331/1 |
| 3,514,698 | 5/1970 | Rey | 331/1 |
| 3,551,826 | 12/1970 | Sepe | 331/1 |
| 3,484,712 | 12/1969 | Foote et al. | 331/1 |

*Primary Examiner*—John Kominski
*Attorney*—Frank R. Trifari

[57] ABSTRACT

The frequency synthesiser consists of a binary rate multiplier giving an output at the desired frequency of the synthesizer, the output however being spectrally impure. The actual output of the synthesiser is taken from a voltage controlled oscillator; in order to maintain the voltage controlled oscillator at the correct frequency its output and that of the binary rate multiplier are supplied to opposite inputs of an up/down counter. The counter gives an error signal when its count varies from a predetermined range. The magnitude of the error is obtained from the binary rate multiplier, and the error signals are supplied via an accumulator to a digital-to-analogue converter controlling the voltage controlled oscillator.

6 Claims, 5 Drawing Figures

INVENTOR.
M. J. UNDERHILL
BY
AGENT

INVENTOR.

M. J. UNDERHILL

BY

AGENT

FREQUENCY SYNTHESISER

The present invention concerns frequency synthesizers.

In the present state of the art frequency synthesizers are expensive to manufacture and often have the disadvantage of are spectrally impure outputs, in that what should be a pure signal of a single frequency is frequency modulated.

The present invention has for an object to provide a frequency synthesizer which gives a spectrally pure output and which also lends itself to manufacture in integrated circuit form with a consequent reduction in cost.

According to one aspect of the present invention there is provided a frequency synthesizer comprising a binary counter driven by a clock pulse source and giving an output pulse at every 0-to-1 transition. A register is provided for selectively gating the output pulses from the counter into one input of an error detection circuit so that for one cycle of the binary counter a predetermined number of pulses are supplied to the error detection circuit at a frequency which is the desired frequency of the frequency synthesizer. A controlled oscillator is coupled to the other input of said error detection circuit and provides a pulse train nominally at the desired frequency of the frequency synthesizer, the error detection circuit giving an error signal on detecting an error between the two frequencies supplied to it. An error control circuit is also provided to which the error signal is supplied and which supplies an error control signal to the controlled oscillator to bring the two frequencies into synchronism.

According to another aspect of the present invention there is provided a frequency synthesizer comprising a desired frequency generator circuit supplying a pulse train of the desired frequency in a spectrally impure form, and a controllable oscillator supplying a pulse train of nominally the same frequency as the desired frequency generator but in spectrally pure form. A reversible counter is provided, to the opposing inputs of which are supplied the pulse trains from the desired frequency generator and the controllable oscillator. An error detection means is coupled to the reversible counter for detecting whenever the count in the reversible counter has departed from a predetermined range, and means for determining the value of the error and supplying an error control signal to the controllable oscillator to bring the two frequencies into synchronism.

One embodiment of the present invention will now be described, by way of example and with reference to the accompanying drawing, in which.

Figure 1:
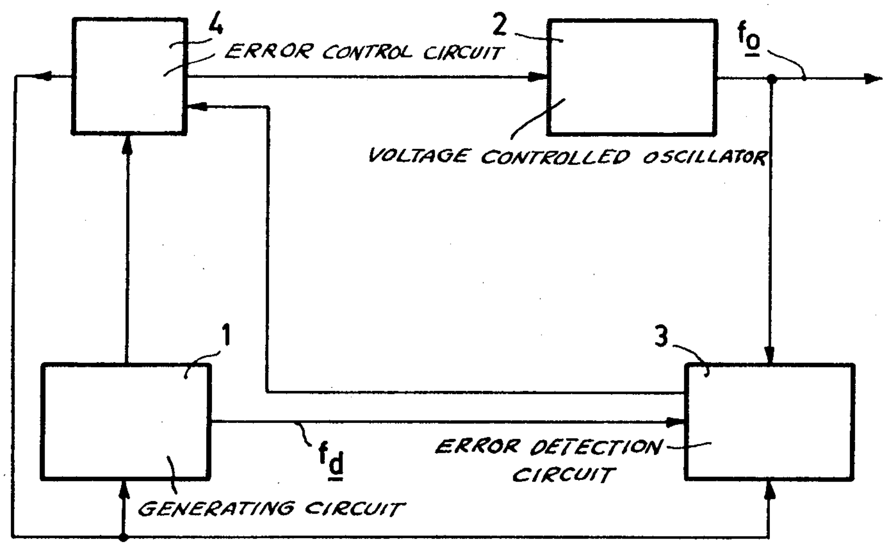
FIG. 1 is a block diagram showing in simplified form the fundamental elements of a frequency synthesizer constructed in accordance with the present invention.
Figure 2:
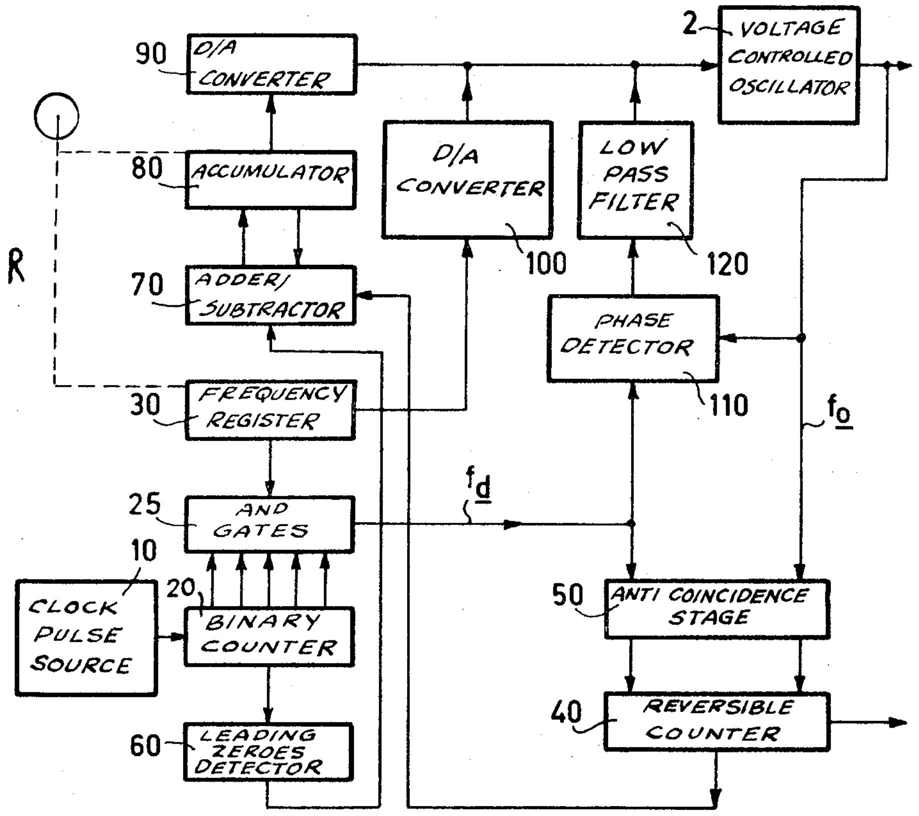
FIG. 2 is a block diagram of a frequency synthesizer constructed in accordance with the present invention.

The frequency synthesizer shown in detail in FIG. 2 of the accompanying drawings may be considered as containing four fundamental circuit units which are shown in the block diagram of FIG. 1. Thus the frequency synthesizer comprises basically a generating circuit 1 giving the desired frequency in a spectrally impure form. The output of the frequency synthesizer is taken from a voltage controlled oscillator 2 which is of nominally the same frequency as the pulse train from the circuit 1. The outputs from the circuit 1 and the voltage controlled oscillator 2 are both taken to an error detection circuit 3 which, upon detection of an error gives an error signal to an error control circuit 4 which in turn controls the voltage controlled oscillator 2.

The various units of this frequency synthesizer will now be considered separately:

DESIRED FREQUENCY GENERATOR

The desired frequency generator 1 consists of a clock pulse source 10 driving a binary counter 20. In a binary counter, for any unit input, only one stage changes from 0 to 1. Considering a four-stage counter there are eight such 0-to-1 transitions in the least significant stage, four in the next, two in the next and one in the most significant stage per cycle of the counter. This means that if pulses are derived from these 0-to-1 transitions, then since the transitions occur at different times they can all be gated into a single output line without risk of coincidence. Hence for a complete cycle of the four-stage counter a maximum of 15 pulses could be gated into the output line. In the present embodiment the counter 20 will obviously have very much more than four stages and the number of stages will be dependent on the range of frequencies required from the frequency synthesizer. In order to obtain a range of frequencies from the desired frequency generator 1 there is provided a desired frequency register 30 which controls a number of AND-gates 25 through which the pulses produced by the 0-to-1 transitions in the binary counter are gated. The AND gates are not shown individually in this FIG. 2 but there is one for every stage of the binary counter 20. If negative logic is used the AND gates would be replaced by OR gates. By presetting the quantity in the desired frequency register 30 the binary counter 20 will produce at each cycle a predetermined number of separate pulses and these can be selected by the desired frequency register 30 to be the desired frequency of the frequency synthesizer. However, the output thus obtained on the output line $f_d$ is spectrally impure. Accordingly the output of the desired frequency generator is used as a reference against which the output of the voltage controlled oscillator 2 is measured. This error sampling is done in the error detector circuit 3. The combination of the binary counter 20, its associated AND-gates 25 and the desired frequency register 30 is known as a binary rate multiplier.

ERROR DETECTOR CIRCUIT 3

The error detector circuit 3 consists of a reversible counter 40, to one input of which the output of the desired frequency generator 1 is supplied and to the other input of which the output of the voltage controlled oscillator 2 is supplied on the line $f_o$. The two input signals are applied to the reversible counter 40 through an anticoincidence stage 50 so as to prevent the simultaneous arrival of an input pulse on each input.

If the two input frequencies have the same frequency, then even though the gated input from the desired frequency generator 1 is out of phase with the spectrally pure input from the voltage controlled oscillator 2, the count in the reversible counter 40 will never exceed the limits from $-1$ to $+1$, that is the count will always be within a range of 3.

However, should there be a variation between the two frequencies, then the count in the counter 40 will either rise or decrease beyond this range in accordance with the polarity of the error. Thus as soon as there is an error of greater than 1 cycle between the frequencies supplied to the counter 40 an error signal is applied to the error control circuit 4. However, it is also necessary to consider the magnitude of the error, and this magnitude can be considered as a function of the time taken to detect the error. Thus the greater the error between the two frequencies, the quicker the error will be detected.

In the present embodiment the magnitude of the error is considered to be inversely proportional to the count in the binary counter 20. As the counter 20 is counting steadily at the clock pulse frequency, the time elapsed since the start of a counter cycle until the detection of an error will be directly proportional to the count in the counter. Thus the error magnitude is dependent on the reciprocal of the count in the counter. An approximate method of obtaining this reciprocal is achieved by making the error equal to $2^n$, where $n$ is the number of leading zeros of the binary number in the counter 20. This figure is obtained by the leading zeros detector 60.

Thus when an error is detected in the reversible counter 40 the binary counter 20 is stopped, and the approximate reciprocal of its count is obtained by the leading zeros detector 60, which can be a form of decoder.

Signals have now been obtained in the reversible counter 40 and the leading zeros detector 60 which give the magnitude and the polarity of a detected error, and these signals are now supplied to the error control circuit 4. The counters 20 and 40 are then reset via the reset line R so as to sample the adjusted output of the voltage controlled oscillator 2.

ERROR CONTROL CIRCUIT

This circuit consists of an adder/subtractor 70 to which are supplied the signals from the leading zeros detector 60 and the counter 40 and which controls the value stored in an accumulator 80. The adder/subtractor circuit 70 and the accumulator 80 may be of the kind described in "Digital Computer Design Fundamentals," by Chu, published by McGraw-Hill, on pgs. 386 to 391. This value in turn controls a digital-to-analogue converter 90 which drives the voltage controlled oscillator 2. When an error is detected in the reversible counter 40 the circuit described will make successive corrections which will bring the frequencies of the voltage controlled oscillator 2 and the desired frequency generator into synchronism.

In order to vary the frequency generated by the frequency synthesizer a single tuning knob may be provided so as to control simultaneously both the desired frequency register 30 and the accumulator 80. This knob could be either manually rotated, or in an automatic system, mechanically driven in order to sweep over a given range of frequencies. Such an arrangement is particularly suitable if the voltage controlled oscillator 2 has a linear characteristic.

In the embodiment shown there are in fact two digital-to-analogue converters, the digital-to-analogue converter 90 handling as previously described the detected errors between the two frequencies, and the second digital-to-analogue converter 100 being connected directly to the desired frequency register 30 and acting as a coarse section for handling altered values of the desired frequency when these are fed into the desired frequency register from the manual tuning dial. However, this has only been done for engineering convenience and the second digital-to-analogue converter may be omitted.

Figure 2A:
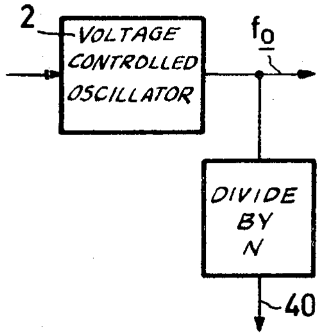
Figure 2B:
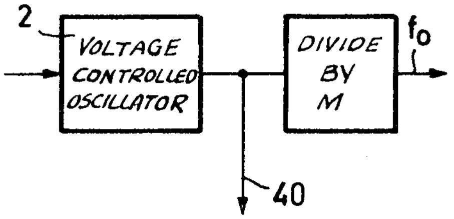

Two minor modifications which can be made to the circuit of FIG. 2 are shown in FIGS. 2*a* and 2*b*.

If the output frequency of the synthesizer is required to be very high, for example in excess of 100 MHz, it becomes very difficult using present technology to manufacture a binary rate multiplier which would operate at the same frequency. In order to avoid this FIG. 2*a* shows a divide-by-*n* circuit placed between the voltage controlled oscillator 2 and the reversible counter 40. This means that the binary rate multiplier can operate *n* times as slowly as the voltage controlled oscillator. The price paid for this is that corrections to bring the two signals into synchronism when an error has been detected will take *n* times as long.

FIG. 2*b* shows an alternative form in which a divide-by-*m* circuit is placed between the voltage controlled oscillator and the output. The binary rate multiplier is now operating *m* times as fast as the required output and corrections of errors are now made at *m* times the speed.

The circuit shown in FIG. 2 also has some additional circuit elements which allow the output frequency to be phase locked when incremental changes are made to the output frequency. For example it may be sufficient for the frequency to be varied over a series of 100 cycle steps. For this purpose a phase detector 110 is connected between the output line $f_o$ from the voltage controlled oscillator 2 and the output line $f_d$ from the binary counter 20. This phase detector 110 has a time constant longer than the cycle time of the counter 20 and gives an output signal to a low-pass filter 120 which directly controls the voltage controlled oscillator 2. The low-pass filter 120 may be replaced by an integrator.

Figure 3:
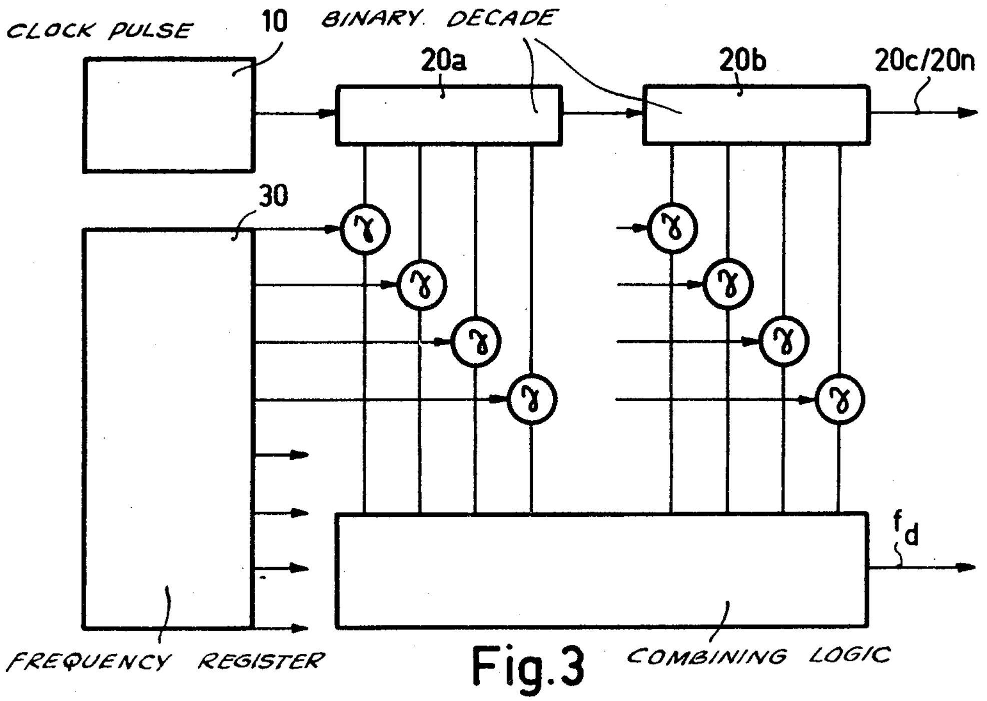
FIG. 3 is a block diagram of a decimal rate multiplier which may be incorporated in the embodiment of FIG. 2.

As described previously, the number stored in the desired frequency register 30 is a binary number. The combination of the binary counter 20, the desired frequency register 30, and the AND gates controlled by the latter to gate the pulses from the binary counter 20 can be known as a binary rate multiplier. However for practical considerations it is usually preferable to use decimal numbers, and the binary rate multiplier may be replaced by the decimal rate multiplier shown diagrammatically in FIG. 3 of the accompanying drawings. In the decimal rate multiplier the single binary counter 20 is replaced by a number of binary decades 20*a*, 20*b* and so on. The outputs from the various stages are then gated from a desired frequency register so that a maximum of nine pulses can be gated from any one decade stage. This can be done by standard combinational logic from the desired frequency register. This can be done by using a 1|1|2|5| code from the desired frequency register.

Various other 8,421 codes can be used in the binary decades, for example excess 2, excess 4, and excess 6 arithmetic can be used which all require a 1125 code from the desired frequency register. Theoretically the desired frequency register could gate the pulses from each binary decade in accordance with any weighted decade code of which the sum of the weights is 9. For example 1|2|2|4 or 1|2|3|3.

What is claimed is:

1. A frequency synthesizer comprising a source of clock pulses, a binary counter coupled to and driven by said source of clock pulses, register means coupled to said counter and gating the output of said counter to provide a predetermined number of pulses from said counter, for each cycle of said counter, corresponding to a first desired frequency of the frequency synthesizer, said register means gating the output of said counter to an error detection circuit, a controllable oscillator providing a controlled second frequency output to said error detection circuit, said error detection circuit including a reversible counter receiving said first desired frequency on a first input and said second frequency signal on a second input, said reversible counter providing a signal indicating error between the two frequencies of the respective inputs applied thereto and means for detecting the magnitude of said error by detecting the count in said binary counter when said reversible counter detects said error, and an error control circuit coupled to said error detection circuit for supplying an error correcting signal proportional to said error signal magnitude to said controllable oscillator for bringing said second frequency into synchronism with said first frequency.

2. A frequency synthesizer as claimed in claim 1, in which the error signals from the reversible counter and from the means detecting the magnitude of the error are supplied to an accumulator.

3. A frequency synthesizer as claimed in claim 2, in which the accumulator gives an output to a digital-to-analogue converter which in turn supplies said signal to the said controllable oscillator.

4. A frequency synthesizer as claimed in claim 3, in which the register gating the pulses from the binary counter is connected to a second digital-to-analogue converter for coarse adjustment of the output frequency of the frequency synthesizer.

5. A frequency synthesizer as claimed in claim 1 and including means for phase locking said controllable oscillator at a plurality of predetermined output frequency levels.

6. A frequency synthesizer as claimed in claim 5, in which the phase-locking means comprise a phase detector to which the gated pulses from the binary counter and a pulse train from said controllable oscillator are supplied, said phase detector having a time constant longer than the cycle time of the binary counter and means for providing the output signal of said phase detector to said controllable oscillator.

* * * * *